United States Patent
Houston et al.

(10) Patent No.: US 9,059,032 B2
(45) Date of Patent: Jun. 16, 2015

(54) SRAM CELL PARAMETER OPTIMIZATION

(75) Inventors: Theodore W. Houston, Richardson, TX (US); Puneet Kohli, Oakland, CA (US); Amitava Chatterjee, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/097,370

(22) Filed: Apr. 29, 2011

(65) Prior Publication Data

US 2012/0275207 A1    Nov. 1, 2012

(51) Int. Cl.
*G11C 11/00*    (2006.01)
*H01L 27/11*    (2006.01)
*H01L 27/02*    (2006.01)
*G11C 11/412*    (2006.01)

(52) U.S. Cl.
CPC ........ *H01L 27/1104* (2013.01); *H01L 27/0207* (2013.01); *G11C 11/412* (2013.01)

(58) Field of Classification Search
CPC .................................................... G11C 11/412
USPC ................................................. 365/154, 156
See application file for complete search history.

(56) References Cited

U.S. PATENT DOCUMENTS

| | | | | |
|---|---|---|---|---|
| 4,910,576 A * | 3/1990 | Campbell et al. | ............. | 257/524 |
| 5,240,874 A * | 8/1993 | Roberts | ........................ | 438/298 |
| 5,291,053 A * | 3/1994 | Pfiester et al. | ................. | 257/393 |
| 5,373,170 A * | 12/1994 | Pfiester et al. | .................. | 257/69 |
| 5,424,985 A * | 6/1995 | McClure et al. | ............. | 365/194 |
| 5,426,065 A * | 6/1995 | Chan et al. | .................... | 438/238 |
| 5,504,705 A * | 4/1996 | Ohkubo | ......................... | 365/156 |
| 5,703,392 A * | 12/1997 | Guo | .............................. | 257/392 |
| 5,939,762 A * | 8/1999 | Lien | .............................. | 257/391 |
| 6,198,656 B1 * | 3/2001 | Zhang | ............................ | 365/154 |
| 6,906,962 B2 * | 6/2005 | Layman et al. | ............... | 365/190 |
| 7,112,857 B2 * | 9/2006 | Liaw | ............................. | 257/392 |
| 7,307,905 B2 * | 12/2007 | Najm et al. | .................... | 365/205 |
| 7,362,606 B2 * | 4/2008 | Chuang et al. | ................ | 365/154 |
| 7,384,839 B2 | 6/2008 | Yang et al. | | |
| 7,486,543 B2 * | 2/2009 | Kang et al. | .................... | 365/156 |
| 7,710,765 B2 * | 5/2010 | Hanafi | ......................... | 365/156 |
| 7,825,437 B2 * | 11/2010 | Pillarisetty et al. | ........... | 257/204 |
| 7,826,252 B2 * | 11/2010 | Wang et al. | .................... | 365/154 |
| 8,134,213 B2 * | 3/2012 | Park | .............................. | 257/393 |
| 8,193,062 B2 * | 6/2012 | Chang et al. | .................. | 438/275 |
| 8,269,284 B2 * | 9/2012 | Nil et al. | ....................... | 257/368 |
| 2003/0123279 A1 * | 7/2003 | Aipperspach et al. | ........ | 365/154 |
| 2003/0214833 A1 * | 11/2003 | Hsu et al. | ...................... | 365/154 |
| 2005/0275117 A1 * | 12/2005 | Kang et al. | .................... | 257/903 |

(Continued)

*Primary Examiner* — Son Mai
(74) *Attorney, Agent, or Firm* — Rose Alyssa Keagy; Frank D. Cimino

(57) ABSTRACT

An integrated circuit having an SRAM cell includes a pair of cross-coupled inverters with first driver and load transistors connected to provide a first storage node and second driver and load transistors connected to provide a second storage node. The SRAM cell also includes first and second pass gate transistors controlled by at least one word line and respectively connected between a first bit line and the first storage node and a second bit line and the second storage node; wherein a first driver transistor threshold voltage is different than a second driver transistor threshold voltage and one of the first and second driver threshold voltages is different than a pass gate transistor threshold voltage. Alternately, a threshold voltage of the first and second driver transistors is different than a symmetrical pass gate transistor threshold voltage. Additionally, methods of manufacturing an integrated circuit having an SRAM cell are provided.

14 Claims, 7 Drawing Sheets

(56) References Cited

U.S. PATENT DOCUMENTS

| | | |
|---|---|---|
| 2006/0274569 A1* | 12/2006 | Joshi et al. ............... 365/154 |
| 2007/0069290 A1* | 3/2007 | Houston et al. ............ 257/345 |
| 2007/0076468 A1* | 4/2007 | Schoellkopf ............... 365/154 |
| 2009/0073758 A1* | 3/2009 | Freeman et al. ............ 365/174 |
| 2010/0177556 A1* | 7/2010 | Chen et al. ................. 365/156 |
| 2010/0207183 A1 | 8/2010 | Houston et al. |
| 2012/0190159 A1* | 7/2012 | Chang et al. ............... 438/217 |

\* cited by examiner

SRAM CELL PARAMETER OPTIMIZATION

TECHNICAL FIELD

The present disclosure is directed to integrated circuits in general, and more specifically, to an integrated circuit including a static random access memory (SRAM) cell and methods of manufacturing an integrated circuit having an SRAM cell.

BACKGROUND

A modern solid state memory is designed to store many millions of bits of information. These bits are stored in individual memory cells that are generally organized into rows and columns to make efficient use of space on a semiconductor substrate containing the memory. Commonly used memory cell architecture includes the six transistor static random access memory (6T SRAM) cell. Particularly as demand for larger memory increases and corresponding sizes of the SRAM cells decrease, optimization of SRAM cell parameters has gained increasing interest. Trade-offs in the design of SRAM cells includes balancing cell parameters such as noise margins, cell stability, leakage current and the robustness of writing and reading operations. Improvement in the ability to balance such parameters would prove beneficial in the art.

SUMMARY

Embodiments of the present disclosure provide an integrated circuit including a static random access memory (SRAM) cell and methods of manufacturing an integrated circuit including an SRAM cell. In one embodiment, the SRAM cell includes a pair of cross-coupled inverters having first driver and load transistors connected to provide a first storage node and second driver and load transistors connected to provide a second storage node. Additionally, the SRAM cell includes first and second pass gate transistors controlled by at least one word line and respectively connected between a first bit line and the first storage node and a second bit line and the second storage node; wherein a first driver transistor threshold voltage is different than a second driver transistor threshold voltage and one of the first and second driver threshold voltages is different than a pass gate transistor threshold voltage.

In another embodiment, the SRAM cell includes a pair of cross-coupled inverters having first driver and load transistors connected to provide a first storage node and second driver and load transistors connected to provide a second storage node. The SRAM cell also includes first and second symmetrical pass gate transistors controlled by at least one word line and respectively connected between a first bit line and the first storage node and a second bit line and the second storage node; wherein a threshold voltage of the first and second driver transistors is different than a symmetrical pass gate transistor threshold voltage.

In another aspect, a method of manufacturing an integrated circuit having an SRAM cell includes providing first and second storage nodes by cross-coupling a pair of inverters having first driver and load transistors and second driver and load transistors. The method also includes supplying first and second pass gate transistors controlled by at least one word line between a first bit line and the first storage node and a second bit line and the second storage node, respectively; wherein a first driver transistor threshold voltage is different than a second driver transistor threshold voltage and one of the first and second driver threshold voltages is different than a pass gate transistor threshold voltage.

In yet another aspect, a method of manufacturing an integrated circuit includes providing first and second storage nodes by cross-coupling a pair of inverters having first driver and load transistors and second driver and load transistors. The method also includes supplying first and second symmetrical pass gate transistors controlled by at least one word line between a first bit line and the first storage node and a second bit line and the second storage node, respectively; wherein a threshold voltage of the first and second driver transistors is different than a symmetrical pass gate transistor threshold voltage.

In still another aspect, a method of manufacturing an integrated circuit having an SRAM cell includes providing first and second storage nodes by cross-coupling a pair of inverters having first driver and load transistors and second driver and load transistors. The method also includes supplying first and second pass gate transistors controlled by at least one word line between a first bit line and the first storage node and a second bit line and the second storage node, respectively; wherein at least a portion of the first driver and pass gate transistors and the second driver and pass gate transistors has different implants to provide different transistor characteristics.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION OF THE DRAWINGS

For a more complete understanding of the present disclosure, reference is now made to the following descriptions taken in conjunction with the accompanying drawings, in which.

DETAILED DESCRIPTION

Generally, it may be recognized that there is a need to optimize the balance of a read current (Iread), an integrated circuit quiescent current or quiescent power supply current (IDDQ), a static noise margin (SNM), and a trip voltage (Vtrip) for compact SRAM cells. A higher magnitude of Iread typically facilitates faster reading of SRAM cell memory states, and a lower magnitude of IDDQ provides lower overall power dissipation for the SRAM cells. A higher magnitude of SNM provides a greater robustness or tolerance against the SRAM cell being upset when perturbed by noise, usually when in a half-addressed (i.e., half-selected) state. A higher value of Vtrip accommodates a greater magnitude of read voltage for the SRAM cell before unwanted cell upset occurs.

Additionally, a threshold voltage may be set by angled pocket implants. With the driver and pass gate being physically close to each other, it is generally difficult to have different threshold voltages for the driver and pass gate transistors without undesired shadowing effects, especially with the practice of using lower cost lithography for implant masking. Embodiments of the present disclosure address these issues.

Figure 1:
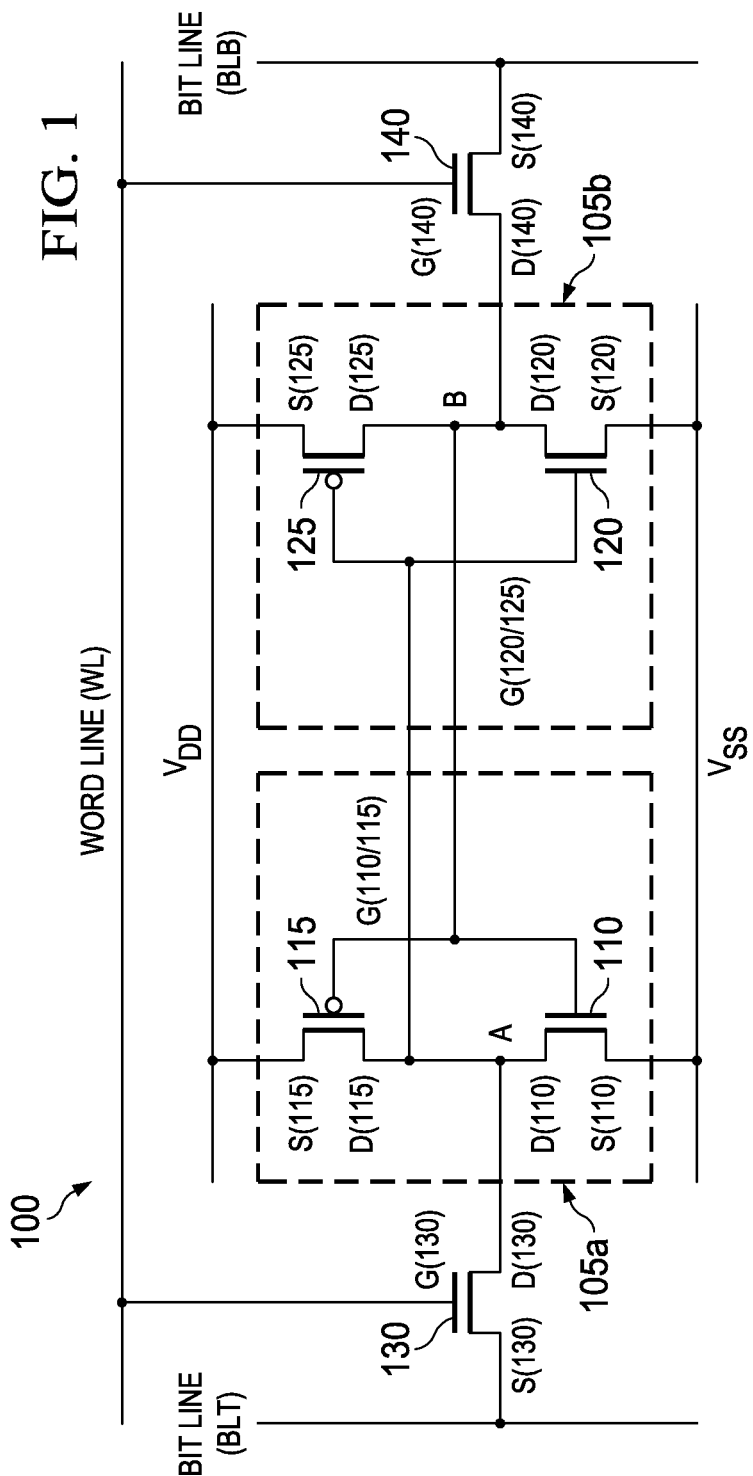
FIG. 1 illustrates an embodiment of an integrated circuit SRAM cell constructed according to the principles of the present disclosure.

FIG. 1 illustrates an embodiment of an integrated circuit SRAM cell 100 constructed according to the principles of the present disclosure. In the illustrated embodiment, the SRAM cell 100 employs six transistors (6T) and includes a pair of CMOS inverters consisting of first and second CMOS inverters 105a, 105b. The first CMOS inverter 105a includes first driver and load transistors 110, 115 having a first storage node A that electrically connects a drain D(110) to a drain D(115), as shown. Correspondingly, the second CMOS inverter 105b includes second driver and load transistors 120, 125 having a second storage node B that electrically connects a drain D(120) to a drain D(125), as also shown.

The first CMOS inverter 105a also includes a first gate structure G(110/115) that electrically connects the gates of the first driver and load transistors 110, 115 together. Correspondingly, the second CMOS inverter 105b includes a second gate structure G(120/125) that electrically connects the gates of the second driver and load transistors 120, 125 together. Cross-connecting the first gate structure G(110/115) to node B and the second gate structure G(120/125) to node A allows the first and second CMOS inverters 105a, 105b to function as a memory element.

The SRAM cell 100 also includes first and second pass gate transistors 130, 140 that are controlled by a word line WL and are respectively connected between the first storage node A and a first bit line BLT and the second storage node B and a second bit line BLB. The first pass gate transistor 130 electrically connects a drain D(130) to the first storage node A, a gate G(130) to the word line WL and a source S(130) to the first bit line BLT. Correspondingly, the second pass gate transistor 140 electrically connects a drain D(140) to the second storage node B, a gate G(140) to the word line WL and a source S(130) to the second bit line BLB.

In general, embodiments of the SRAM sell 100 may be included in the integrated circuit in an embedded memory connected to other portions of the integrated circuit. Alternately, the SRAM cell 100 may be included in a discrete memory contained in the integrated circuit.

SRAM cell parameters may exhibit driver threshold voltages that are different from each other or different from pass gate threshold voltages due to random parameter variations (e.g., random dopant fluctuation or line edge roughness) or structural variations (e.g., drawn device dimensions including width and length variations) that are unintended. Other SRAM cell parameters may exhibit these differences due to systematic variations (e.g., etch rate differences between wafer center and edge or context dependence of dopant diffusion and segregation).

Therefore, for purposes of this disclosure, the term "threshold voltage" means the average value of an intended threshold voltage. When a first threshold voltage is said to be different (e.g., larger or smaller) from a second threshold voltage, the average value of the first threshold voltage is different by a statistically significant amount from the second threshold voltage.

A transistor is defined to be a "symmetrical transistor" when its source and drain implants are intended to be the same (i.e., symmetrical source-drain). Correspondingly, a transistor is defined to be an "asymmetrical transistor" when its source and drain implants are intended to be different (i.e., asymmetrical source-drain). Additionally, asymmetry in which there is a difference between two corresponding transistors (e.g., two driver transistors) in an SRAM cell is defined as "cell asymmetry."

In a first case, SRAM cell embodiments of the present disclosure may employ symmetrical or asymmetrical driver transistors having different threshold voltages. For this first case, one of first and second driver transistor threshold voltages may be different than a pass gate transistor threshold voltage. Additionally, both of the first and second pass gate transistors may be symmetrical transistors or asymmetrical transistors. Alternately, one of the first and second pass gate transistors may be a symmetrical transistor and the other may be an asymmetrical transistor.

For this first case, one embodiment of the SRAM cell 100 provides a first driver transistor threshold voltage that is greater than a second driver transistor threshold voltage and a second pass gate transistor threshold voltage. The second driver and pass gate transistors 120 and 140 may be connected to allow a single sided read for the SRAM cell 100 in another embodiment of this first case (as generally discussed with respect to FIGS. 2A and 2B below). In yet another embodiment of this first case, the first and second driver and pass gate transistors 110, 120 and 130, 140 are included as part of a short aspect ratio (SAR) topology having alternating pairs of driver and pass gate transistors.

In a second case, SRAM cell embodiments of the present disclosure may employ first and second symmetrical pass gate transistors wherein a threshold voltage of first and second driver transistors is different than a symmetrical pass gate transistor threshold voltage. For this second case, an alternate embodiment of the SRAM cell 100 provides a threshold voltage of the first and second driver transistors 110, 120 that is greater than a threshold voltage of a second symmetrical pass gate transistor.

Additionally, another embodiment related to the alternate embodiment of this second case provides the second driver and pass gate transistors 120 and 140 connected to allow a single sided read for the SRAM cell 100 (as generally discussed with respect to FIGS. 2A and 2B below). Also, yet another embodiment of this second case provides the first and second driver and pass gate transistors 110, 120 and 130, 140 as part of a short aspect ratio (SAR) topology having alternating pairs of driver and pass gate transistors.

A broader optimization of SRAM cell 100 parameters is to provide different implants for at least a portion of the first driver and pass gate transistors 110, 130 and the second driver and pass gate transistors 120, 140 to enhance different transistor parameters and SRAM operating characteristics.

Generally, providing a different threshold voltage for driver and pass gate transistors employs conflicting tradeoffs. A low threshold voltage for the pass gate transistor improves Iread with little or no impact on IDDQ. A low threshold voltage for the driver transistor also improves Iread, but it is not as critical as for the pass gate transistor. Also, a low threshold voltage for the driver transistor generally increases IDDQ. Alternately, a high threshold voltage for the driver transistor improves SNM while a low threshold voltage for the pass gate transistor improves Vtrip. The ratio of pass gate to driver transistor threshold voltages also affects SNM.

A higher threshold voltage for a driver transistor relative to a pass gate transistor provides a better Iread/IDDQ ratio. Having the driver transistor with the higher threshold voltage only on one side of the SRAM cell 100 allows lowering IDDQ without lowering the Iread on the other (strong) side. Not raising the threshold voltage of the pass gate transistor on the weak side avoids degradation of Vtrip. Using an asymmetrical driver transistor to raise the threshold voltage of the driver transistor relaxes lithographic requirements and lowers gate edge drain leakage.

Figure 2A:
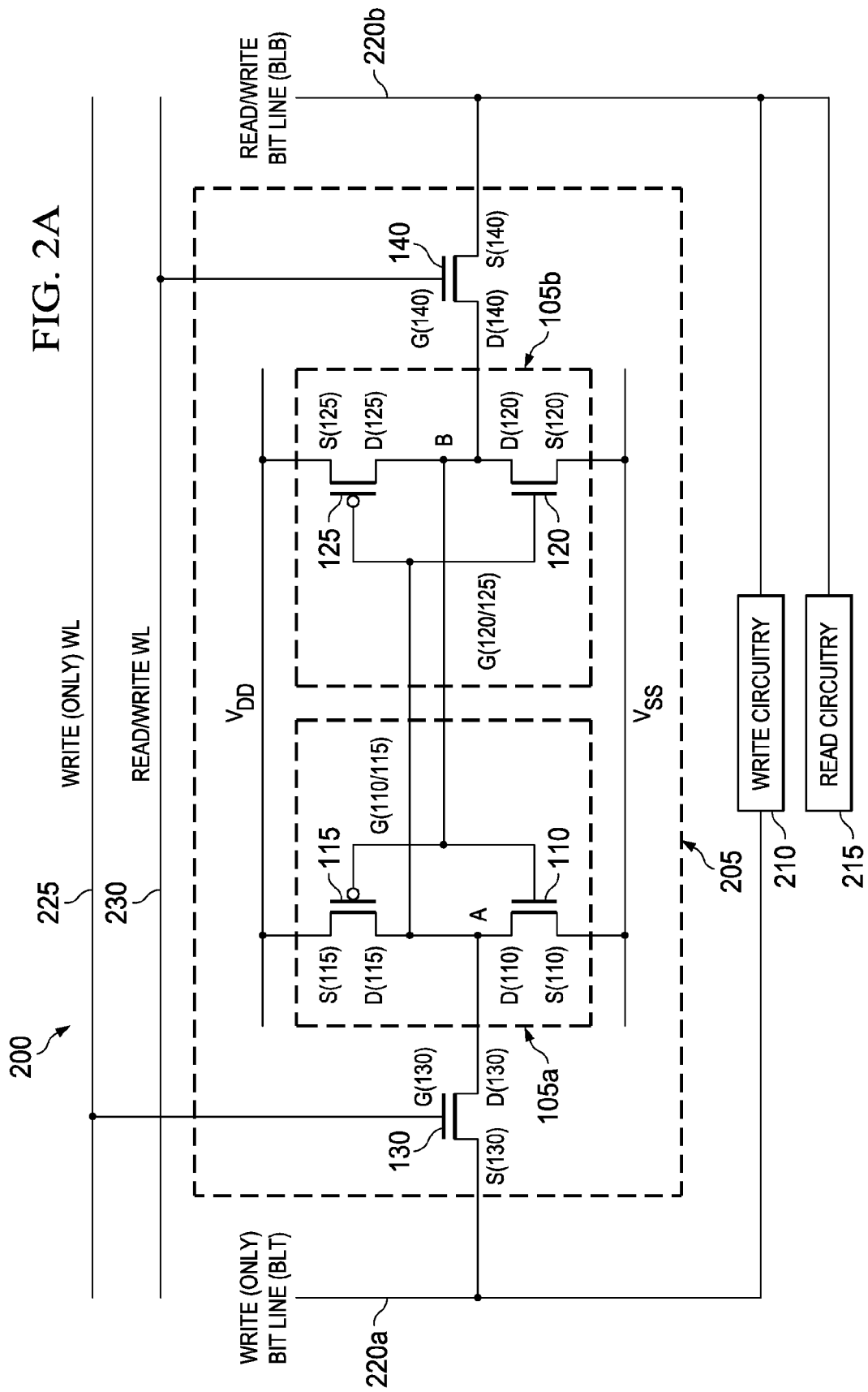
FIGS. 2A and 2B illustrate an embodiment of a portion of an integrated circuit SRAM array and associated SRAM waveforms constructed according to the principles of the present disclosure.
Figure 2B:
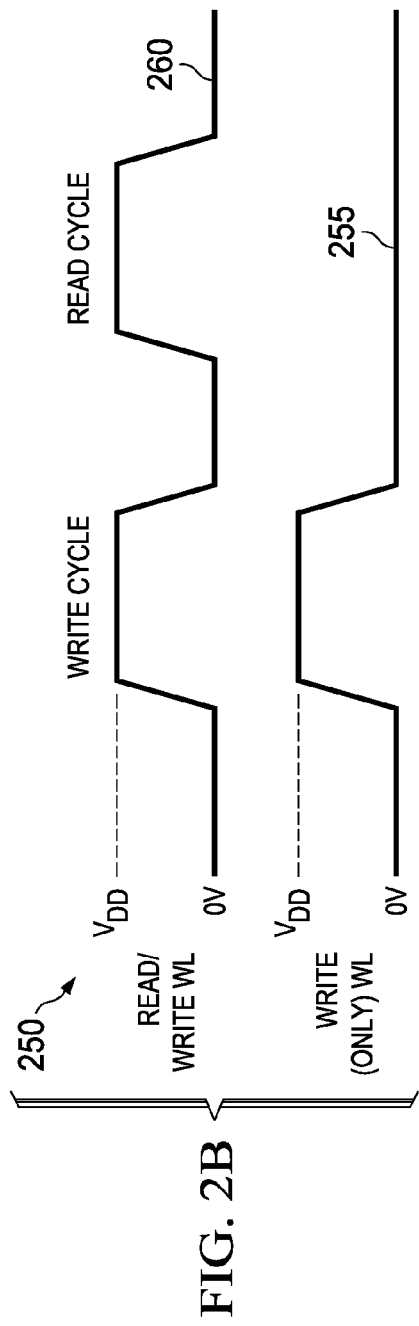

FIGS. 2A and 2B illustrate an embodiment of a portion of an integrated circuit SRAM array and associated SRAM waveforms, generally designated 200, 250, constructed according to the principles of the present disclosure. In the illustrated embodiment, the SRAM array 200 includes an SRAM cell 205 that is connected to provide a single sided read operation for the SRAM cell 100. Generally, operation of the SRAM cell 205 as a memory cell reflects that of the SRAM cell 100. Here, however, the second driver transistor 120 and pass gate transistor 140 are connected to provide the single sided read operation.

The SRAM array 200 also includes write circuitry 210 that is connected to a write (only) bit line 220a and a read/write bit line 220b, read circuitry 215 that is connected to the read/write bit line 220b, a write (only) word line 225 and a read/write word line 230. The write word line 225 controls the first pass-gate transistor 130 and the read/write word line 230 controls the second pass-gate transistor 140. The SRAM waveforms 250 include a write (only) waveform 255 corresponding to the write word line 225, and a read/write waveform 260 corresponding to the read/write word line 230. The write word line 225 is asserted only in a write cycle, and the read/write word line 230 is asserted for both read and write cycles.

The SRAM cell 205 is an embodiment of the SRAM cell 100 wherein a threshold voltage $Vt_{d1}$ of the first driver transistor 110 is greater than a threshold voltage $Vt_{d2}$ of the second driver transistor 120 and threshold voltages $Vt_{pg1}$, $Vt_{pg2}$ of the first and second pass gate transistors 130, 140. Providing the higher threshold voltage $Vt_{d1}$ for the first driver transistor 110 on the non-read side of the SRAM cell 205 may improve cell stability and lowers IDDQ without lowering read current. The resulting improved cell stability may allow stronger pass gates thereby improving read current and write margin whereas a higher threshold voltage $Vt_{d2}$ on the read side would lower read current.

In an alternate embodiment of the SRAM cell 205, first and second pass gate transistors 130, 140 are symmetrical transistors and a threshold voltage $Vt_d$ of the first and second driver transistors 110, 120 is greater than a threshold voltage $Vt_{pg2}$ of the second symmetrical pass gate transistor. Providing the threshold voltage $Vt_d$ greater than the threshold voltage $Vt_{pg2}$ may facilitate the single sided read operation, as well.

Generally, where SRAM driver and pass gate transistors are NMOS transistors (as shown in FIGS. 1 and 2A) several approaches may be employed to provide lower or higher values of threshold voltages. For a first approach, a first step is to open all SRAM driver and pass gate transistors to implantation and use a boron implant that is self-aligned to the gates (e.g., pocket or halo implants) to set a lower value of threshold voltage. As a second step, selectively open a subset of the SRAM driver and pass gate transistors to implantation and use a boron implant self-aligned to the gates to raise the threshold voltage of the selected subset of exposed SRAM driver or pass gate transistors.

As an alternate to the first and second steps for the first approach, a relatively higher energy boron implant may be employed that penetrates the gate (i.e., a through-gate implant (TGI)) to raise the threshold voltage of the exposed NMOS driver and pass gate transistors. An advantage of TGI is that vertical implanting may be used to avoid resist shadowing. Additionally, vertical halo implants may be used but, typically, halo implants are tilted to get the dopants into the channel efficiently. Here, any combination of halo and TGI implanting can be used.

For a second approach, a first step is to selectively open a subset of SRAM driver or pass gate transistors to implantation that are to have one value of threshold voltage. Use a boron implant that is self-aligned to the gate (e.g., pocket or halo implants) to set their threshold voltages. As a second step, selectively open a subset of SRAM driver and pass gate transistors to implantation that is to have a second value of threshold voltage. Use a boron implant self-aligned to the gate (e.g., pocket or halo implants) to set their threshold voltages.

As an alternate to the first and second steps for the second approach, use a relatively higher energy boron implant that penetrates the gate (e.g., TGI) to raise the threshold voltage of the exposed NMOS driver and pass gate transistors. Again, any combination of halo and TGI implanting can be used. Of course, similar schemes may be constructed where donor type dopants (such as phosphorus and arsenic) may be used to lower SRAM NMOS driver and pass gate transistor threshold voltages.

Figure 3:
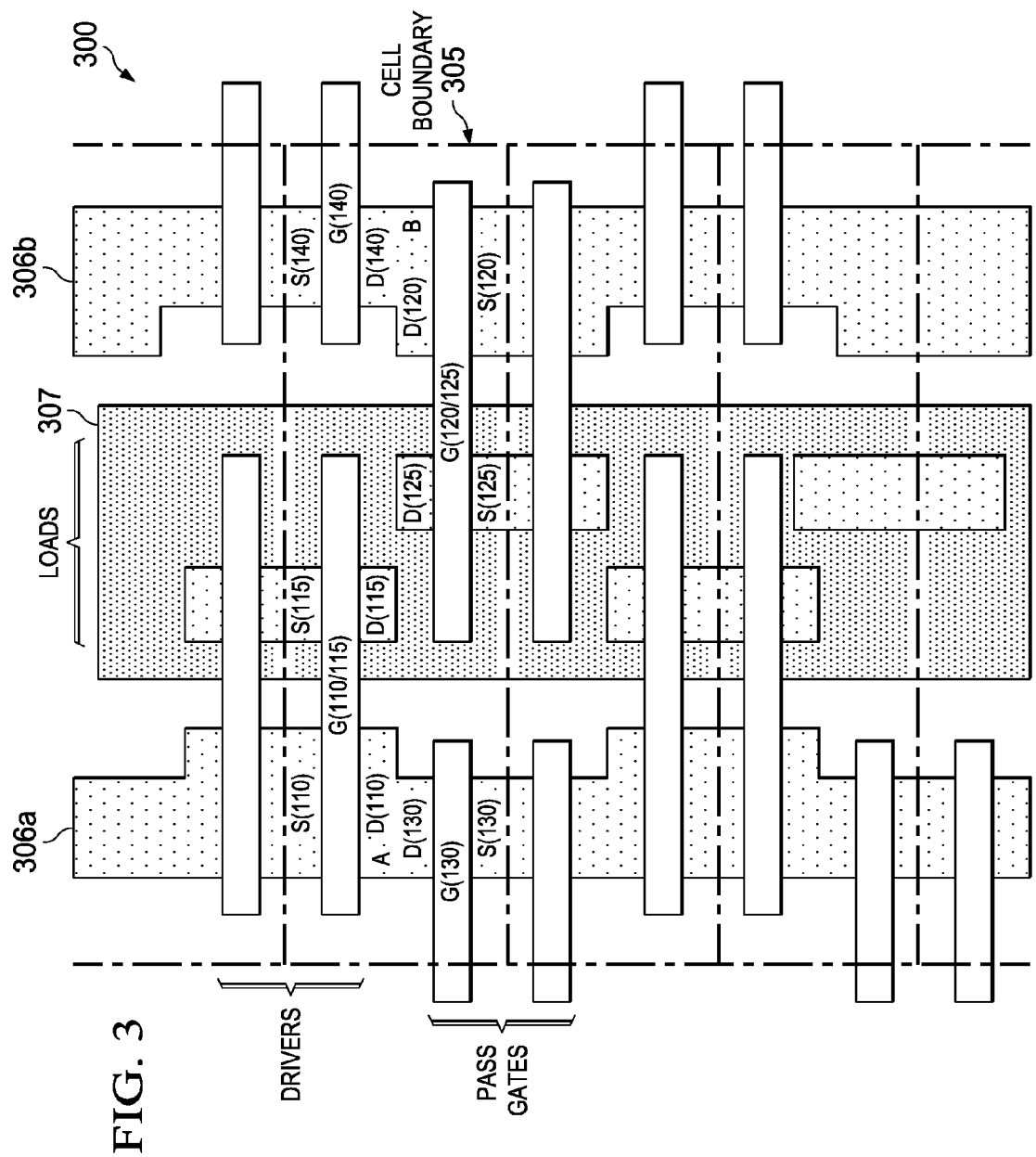
FIG. 3 illustrates a physical layout diagram corresponding to an embodiment of an SRAM cell as may be employed in the SRAM cells of FIGS. 1 and 2A.

FIG. 3 illustrates a physical layout diagram corresponding to an embodiment of an SRAM cell, generally designated 300, as may be employed in the SRAM cells of FIGS. 1 and 2A. The physical layout diagram 300 shows layout of an array of several SRAM cells employing short aspect ratio (SAR) topology, which is a general topology where all gate structures are parallel. An SRAM cell layout 305 is representative of the SRAM cells employed in FIGS. 1 and 2A.

With the SAR topology, there are stripes of active 306a, 306b with alternating pairs of driver and pass gate NMOS transistors and an Nwell 307 having actives for the PMOS load transistors, as shown. The SRAM cell layout 305 corresponds to the SRAM cells 100 and 205, as typical. The stripe of active 306a includes the first driver and pass gate transistors 110, 130 having driver transistor S(110), D(110) and pass gate transistor D(130) S(130), as shown. The gate structure G(110/115) connects the driver transistor 110 and the load transistor 115 having load transistor S(115), D(115), as shown. The pass gate transistor G(130) is connected to bit line BLT (not shown in FIG. 3).

Correspondingly, the stripe of active 306b includes the second driver and pass gate transistors 120, 140 having driver transistor S(120), D(120) and pass gate transistor D(140) S(140), as shown. The gate structure G(120/115) connects the driver transistor 120 and the load transistor 125 having load transistor S(125), D(125), as shown. The pass gate transistor G(140) is connected to bit line BLB (not shown in FIG. 3). As will be discussed further in FIG. 4, driver transistor sources are adjacent to one another whereas their drains are adjacent to pass gate transistor drains.

Figure 4:
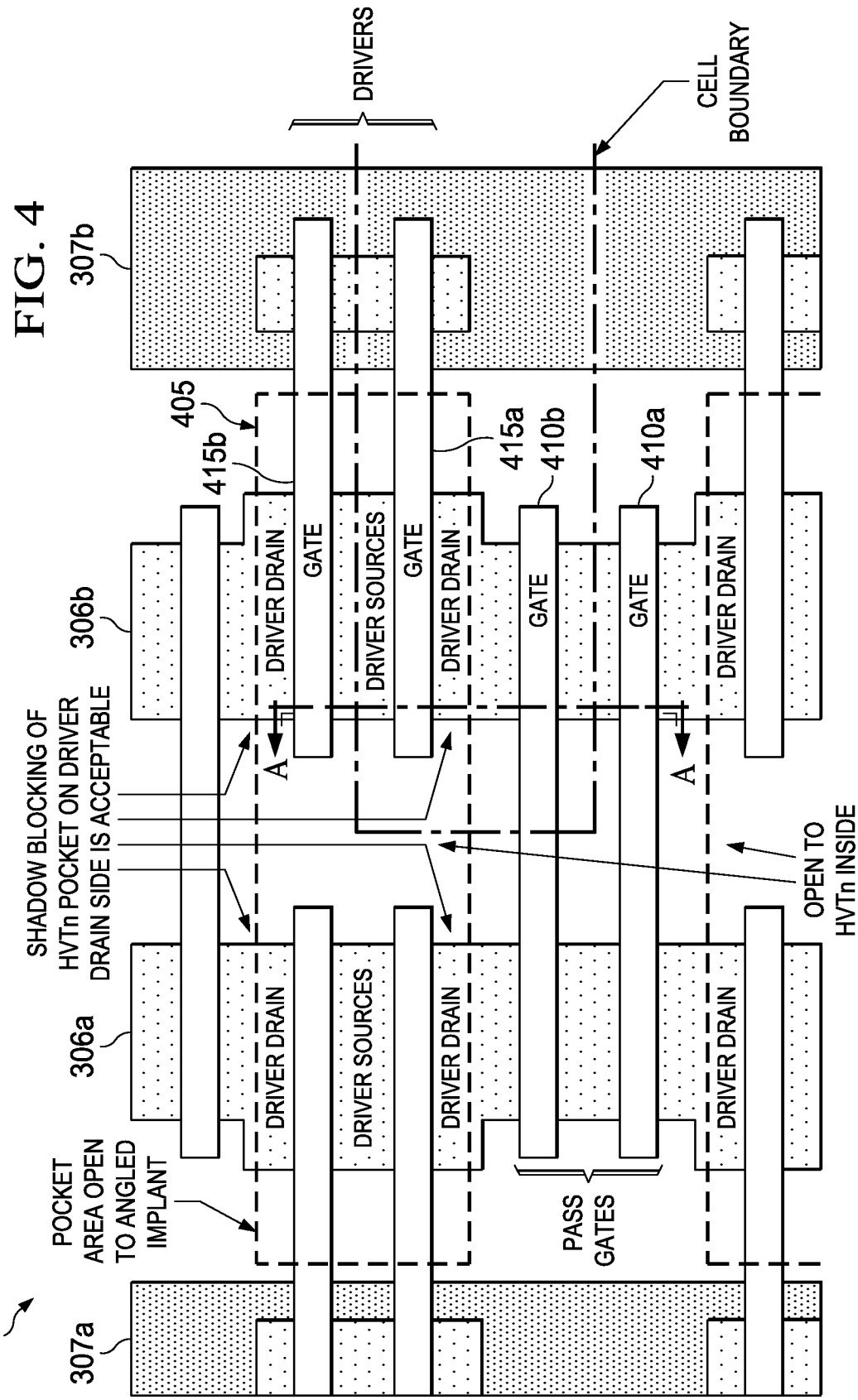
FIG. 4 illustrates another physical layout diagram corresponding to an embodiment of an SRAM cell as may be employed in the SRAM cells of FIGS. 1 and 2A.

FIG. 4 illustrates another physical layout diagram corresponding to an embodiment of an SRAM cell, generally designated 400, as may be employed in the SRAM cells 100 and 205 of FIGS. 1 and 2A. The layout diagram 400 is a slightly different view of the layout diagram 300. The layout diagram 400 shows a partial cell boundary for an SRAM cell layout (such as, SRAM cell layout 305). Here, the view has been shifted to focus on one of the pairs of driver transistors showing that pocket areas are open in a resist covering the pairs of pass gates.

The threshold voltage of the driver transistors is mainly determined by driver transistor source implantation. A lower threshold voltage implant may be applied to driver transistors and pass gate transistors prior to covering the pass gates with resist (as discussed above). Driver transistor sources are proximate a middle of a pocket 405 while driver transistor drains are proximate pass gate transistor drains. Resist-covered pass gate transistors cause shadowing of driver transistor drains by angle pocket implants while driver transistor sources may receive appropriate implanting from angle pocket implants for higher threshold voltage implants.

Therefore, good differentiation between driver and pass gate transistor threshold voltages may be obtained even though a high threshold voltage implant is shadowed from the drain side of the driver transistor. A different resist mask would also allow pass gate transistor sources to be implanted with different threshold voltages. A discussion of the area represented by the partial section AA shown in FIG. 4 is provided in FIG. 5.

Figure 5:
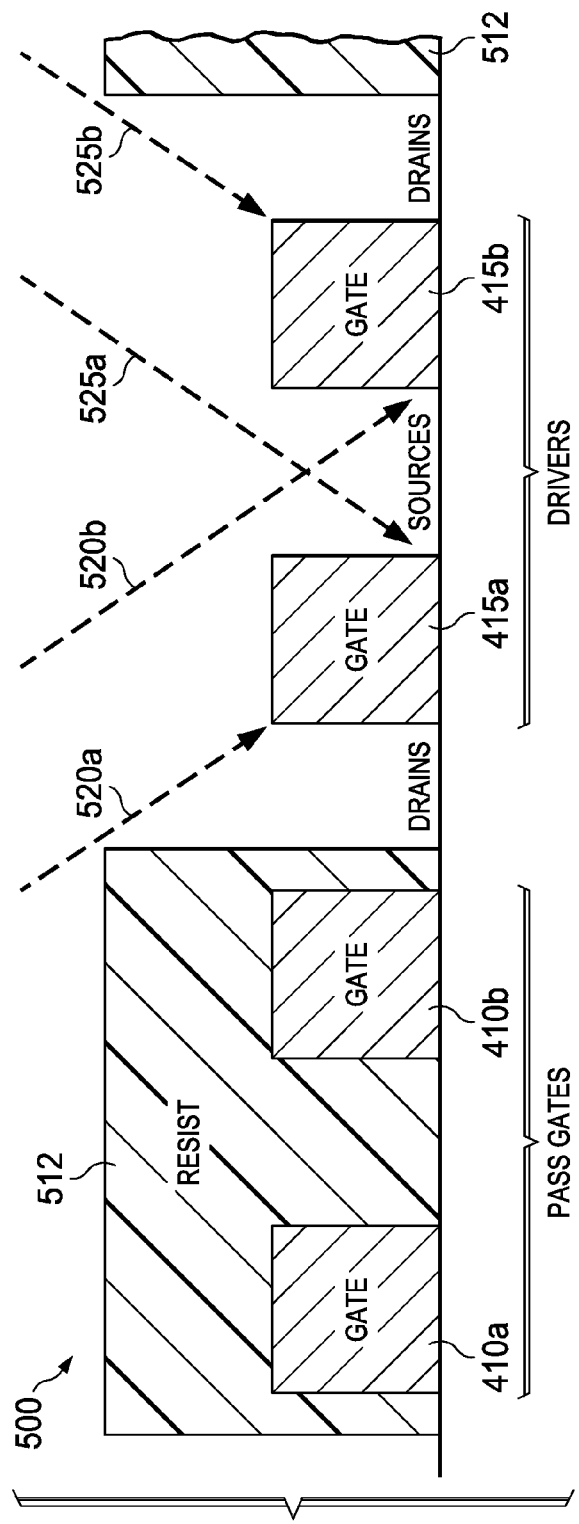
FIG. 5 illustrates a sectional view of a portion of the physical layout diagram of FIG. 4.

FIG. 5 illustrates a sectional view, generally designated 500, of a portion of the physical layout diagram of FIG. 4. The sectional view 500 is indicated in FIG. 4 as the partial section AA, where it is taken across gates 410*a*, 410*b*, 415*a* and 415*b* for pass gate and driver transistor structures, as shown. The gates 410*a*, 410*b* for the pass gate transistors are shown having a covering resist 512. The gates 415*a*, 415*b* for the driver transistors are open to implants, as discussed with respect to FIG. 4. Generally, there are better short channel effects with a pocket threshold voltage implant as compared to a channel threshold voltage implant.

As shown in FIG. 5, diametrically rotated angle pocket implants 520*a*, 520*b* and 525*a*, 525*b* reach driver transistor sources but are shadowed (i.e., at least partially blocked) from reaching the driver transistor drains by the covering resist 512. If an initial threshold voltage implant is employed for the driver transistors and only one direction of angle pocket implants for a higher threshold voltage is employed, one of the two drivers shown would typically have a higher threshold voltage than the other. A different resist mask that opens selected pass gate transistor structures and covers the driver transistor structures would also allow pass gate transistor sources to be implanted with threshold voltages different from the driver transistors.

Figure 6:
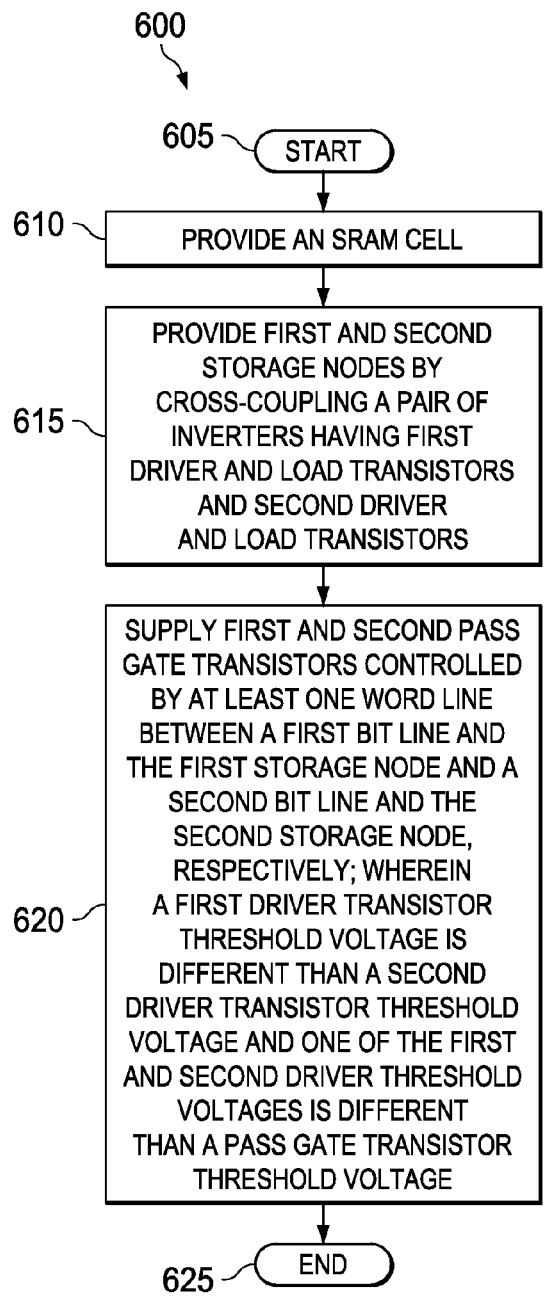
FIG. 6 illustrates a flow diagram of an embodiment of a method of manufacturing an SRAM cell carried out according to the principles of the present disclosure.

FIG. 6 illustrates a flow diagram of an embodiment of a method of manufacturing an SRAM cell, generally designated 600, carried out according to the principles of the present disclosure. The method 600 starts in a step 605, and in a step 610, an SRAM cell is provided. Then, first and second storage nodes are provided by cross-coupling a pair of inverters having first driver and load transistors and second driver and load transistors, in a step 615.

First and second pass gate transistors controlled by at least one word line are supplied between a first bit line and the first storage node and a second bit line and the second storage node, respectively; wherein a first driver transistor threshold voltage is different than a second driver transistor threshold voltage and one of the first and second driver threshold voltages is different than a pass gate transistor threshold voltage, in a step 620. Generally, the first pass gate transistor or the second pass gate transistor may be a symmetrical transistor or an asymmetrical transistor, and a threshold voltage difference is 100 millivolts or greater.

In one embodiment, a smaller threshold voltage dopant is implanted into the first and second driver transistors and the first and second pass gate transistors and thereafter a larger threshold voltage dopant is implanted into at least one of the first and second driver transistors and the first and second pass gate transistors. Additionally, the smaller or larger threshold voltage dopant is implanted by an angled pocket implant provided from a single direction or from diametrically rotated directions. In another embodiment, a threshold voltage dopant may be implanted into a jointly open subset of the first and second driver transistors and the first and second pass gate transistors thereby allowing additional masked implants to selectively alter electrical characteristics of the exposed transistors. The method 600 ends in a step 625.

Figure 7:
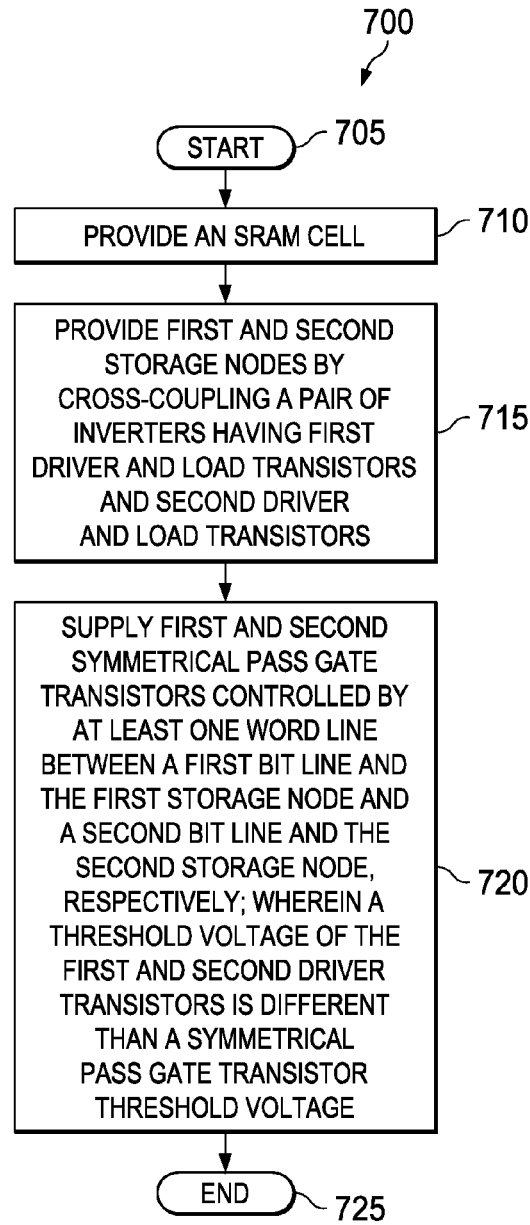
FIG. 7 illustrates a flow diagram of another embodiment of a method of manufacturing an SRAM cell carried out according to the principles of the present disclosure.

FIG. 7 illustrates a flow diagram of another embodiment of a method of manufacturing an integrated circuit including an SRAM cell, generally designated 700, carried out according to the principles of the present disclosure. The method 700 starts in a step 705, and in a step 710, an SRAM cell is provided. Then, first and second storage nodes are provided by cross-coupling a pair of inverters having first driver and load transistors and second driver and load transistors, in a step 715.

First and second symmetrical pass gate transistors controlled by at least one word line are supplied between a first bit line and the first storage node and a second bit line and the second storage node, respectively; wherein a threshold voltage of the first and second driver transistors is different than a symmetrical pass gate transistor threshold voltage, in a step 720. Generally a threshold voltage difference is 100 millivolts or greater.

In one embodiment, a smaller threshold voltage dopant is implanted into the first and second driver transistors and the first and second symmetrical pass gate transistors and thereafter a larger threshold voltage dopant is implanted into at least one of the first and second driver transistors and the first and second symmetrical pass gate transistors. In another embodiment, a threshold voltage dopant is implanted into a jointly open subset of the first and second driver transistors and the first and second symmetrical pass gate transistors thereby allowing additional masked implants to selectively alter electrical characteristics of the exposed transistors. The method 700 ends in a step 725.

Figure 8:
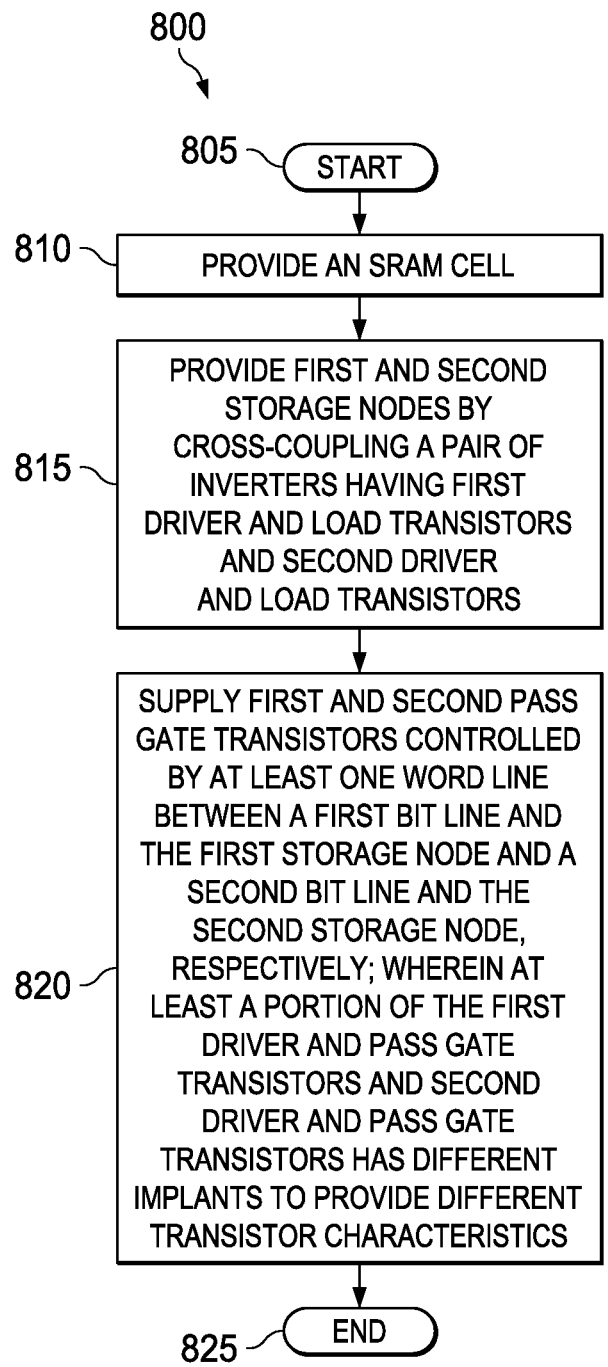
FIG. 8 illustrates a flow diagram of still another embodiment of a method of manufacturing an integrated circuit including an SRAM cell carried out according to the principles of the present disclosure.

FIG. 8 illustrates a flow diagram of still another embodiment of a method of manufacturing an integrated circuit including an SRAM cell, generally designated 800, carried out according to the principles of the present disclosure. The method 800 starts in a step 805, and in a step 810, an SRAM cell is provided. Then, first and second storage nodes are provided by cross-coupling a pair of inverters having first driver and load transistors and second driver and load transistors, in a step 815.

First and second pass gate transistors controlled by at least one word line are supplied between a first bit line and the first storage node and a second bit line and the second storage node, respectively; wherein at least a portion of the first driver and pass gate transistors and the second driver and pass gate transistors has different implants to provide different transistor characteristics. In one embodiment, a threshold voltage dopant is implanted into a jointly open subset of the first and second driver transistors and the first and second symmetrical pass gate transistors thereby allowing additional masked implants to selectively alter electrical characteristics of the exposed transistors. The method 800 ends in a step 825.

While the methods disclosed herein have been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

Those skilled in the art to which the disclosure relates will appreciate that other and further additions, deletions, substitutions and modifications may be made to the described example embodiments without departing from the disclosure.

What is claimed is:

1. An integrated circuit including a static random access memory (SRAM) cell, comprising:
   a pair of cross-coupled inverters having a first asymmetrical driver and a load transistor connected to provide a first storage node and second driver and load transistors connected to provide a second storage node; and
   first and second pass gate transistors controlled by at least one word line and respectively connected between a first bit line and the first storage node and a second bit line and the second storage node;
   wherein a channel dopant level of the first driver transistor is different than a channel dopant level of the second driver transistor so that the threshold voltages of the first and second driver transistors differ from one another;
   and wherein the channel dopant level of the first driver transistor is different than a channel dopant level of the first and second pass gate transistors so that the threshold voltages of the first driver transistor differs from that of the first and second pass gate transistors.

2. The integrated circuit as recited in claim 1 wherein the first pass gate transistor or the second pass gate transistor is a symmetrical transistor or an asymmetrical transistor.

3. The integrated circuit as recited in claim 1 wherein the first and second driver transistors and the first and second pass gate transistors are NMOS transistors;
   and wherein the threshold voltage of the first driver transistor is greater than the second driver transistor and the first and second pass gate transistors.

4. The integrated circuit as recited in claim 3, further comprising:
   read circuitry, coupled to the second bit line but not to the first bit line, so that the second driver and pass gate transistors provide a single sided read.

5. An integrated including a static random access memory (SRAM) cell, comprising:
   a pair of cross-coupled inverters having a first asymmetrical driver and a load transistor connected to provide a first storage node and second driver and load transistors connected to provide a second storage node; and
   first and second pass gate transistors controlled by at least one word line and respectively connected between a first bit line and the first storage node and a second bit line and the second storage node;
   wherein a first driver transistor threshold voltage dopant level is different than a second driver transistor threshold voltage dopant level and one of the first and second driver threshold voltage dopant levels are different than a pass gate transistor threshold voltage dopant level;
   and wherein the first and second driver and pass gate transistors are included as part of a short aspect ratio (SAR) topology having alternating pairs of driver and pass gate transistors.

6. The integrated circuit of claim 1,
   wherein the first and second pass gate transistors are symmetrical transistors.

7. An integrated circuit including a static random access memory (SRAM) cell, comprising:
   a pair of cross-coupled inverters having a first asymmetrical driver and a load transistor connected to provide a first storage node and second driver and load transistors connected to provide a second storage node; and
   first and second symmetrical pass gate transistors controlled by at least one word line and respectively connected between a first bit line and the first storage node and a second bit line and the second storage node;
   wherein a threshold voltage dopant level of the first and second driver transistors is different than a symmetrical pass gate transistor threshold voltage dopant level;
   and wherein the first and second driver and symmetrical pass gate transistors are included as part of a short aspect ratio (SAR) topology having alternating pairs of driver and pass gate transistors.

8. A method of manufacturing an integrated circuit including a static random access memory (SRAM) cell, comprising:
   providing first and second storage nodes by cross-coupling a pair of inverters having first driver and load transistors and second driver and load transistors; and
   supplying first and second symmetrical pass gate transistors controlled by at least one word line between a first bit line and the first storage node and a second bit line and the second storage node, respectively;
   implanting a threshold voltage implant dosage into the first driver transistor to produce a channel dopant level different than the channel dopant level of the second driver transistor and the first and second pass gate transistors.

9. The method as recited in claim 8 wherein the implanting step comprises:
   implanting boron into the channels of the first and second driver transistors and the first and second symmetrical pass gate transistors; and
   implanting boron into the channel of the first driver transistors.

10. The method as recited in claim 8 wherein the implanting step causes the threshold voltage of the first driver transistor to differ from that of the second driver transistor by 100 millivolts or greater.

11. A method of manufacturing an integrated circuit including a static random access memory (SRAM) cell, comprising:
   providing first and second storage nodes by cross-coupling a pair of inverters having first driver and load transistors and second driver and load transistors; and
   supplying first and second symmetrical pass gate transistors controlled by at least one word line between a first bit line and the first storage node and a second bit line and the second storage node, respectively;
   wherein a threshold voltage implant dosage of one of the first and second driver transistors is different than the threshold voltage implant dosage of its corresponding symmetrical pass gate transistor;
   and further comprising implanting a threshold voltage dopant into a jointly open subset of the first and second driver transistors and the first and second symmetrical pass gate transistors.

12. The method as recited in claim 1 wherein the threshold voltages of the first and second driver transistors differ from one another by at least 100 millivolts.

13. The method as recited in claim 6 wherein the threshold voltages of the first and second driver transistors differ from one another by at least 100 millivolts.

14. The method as recited in claim 8 wherein the implanting step comprises:
- implanting a first dosage of boron into the channels of the second driver transistor and the first and second symmetrical pass gate transistors to set a first threshold voltage for those transistors; and
- implanting a second dosage of boron into the channel of the first driver transistor to set a second threshold voltage different, from the first threshold voltage, for the first driver transistor.

* * * * *